(12) United States Patent
Chatterjee et al.

(10) Patent No.: US 7,489,205 B2
(45) Date of Patent: Feb. 10, 2009

(54) VCO BUFFER CIRCUIT

(75) Inventors: Kallol Chatterjee, West Bengal (IN); Samala Sreekiran, Noida (IN)

(73) Assignee: STMicroelectronics Pvt. Ltd., Noida, Uttar Pradesh (IN)

( * ) Notice: Subject to any disclaimer, the term of this patent is extended or adjusted under 35 U.S.C. 154(b) by 98 days.

(21) Appl. No.: 11/146,930

(22) Filed: Jun. 6, 2005

(65) Prior Publication Data
US 2005/0270110 A1 Dec. 8, 2005

(30) Foreign Application Priority Data
Jun. 4, 2004 (IN) .................. 1041/DEL/2004

(51) Int. Cl.
*H03L 7/00* (2006.01)
(52) U.S. Cl. ............... 331/74; 331/45; 331/57; 327/66; 327/298
(58) Field of Classification Search .......... 331/74, 331/185, 57, 45; 327/66, 298
See application file for complete search history.

(56) References Cited

U.S. PATENT DOCUMENTS

| 6,683,505 B2 * | 1/2004 | West .................. 331/57 |
| 6,703,890 B2 * | 3/2004 | Fukui ............... 327/534 |
| 7,053,722 B2 * | 5/2006 | Rein et al. ........... 331/117 R |
| 2003/0038685 A1 | 2/2003 | West |

* cited by examiner

*Primary Examiner*—Robert Pascal
*Assistant Examiner*—Levi Gannon
(74) *Attorney, Agent, or Firm*—Lisa K. Jorgenson; Paul F. Rusyn; Graybeal Jackson LLP (57) ABSTRACT

A VCO buffer circuit comprising a first loading means receiving a first signal for loading the VCO at a first input node; a second loading means receiving a second signal for loading the VCO at a second input node; a third loading means coupled to said first loading means for loading the VCO at third input node to thereby balance a load distribution on three nodes of VCO. At least three current controlling means are coupled to each other to form a symmetrical configuration and receive input signals from said first and second loading means for minimizing variations in the oscillation frequency of the VCO. A buffering means is connected to the output of the controlling means for buffering the output of the current controlling means.

15 Claims, 5 Drawing Sheets

**Figure 1
(Background)**

**Figure 2
(Background)**

**Figure 3
(Background)**

Figure 4
(Background)

Figure 5

VCO BUFFER CIRCUIT

PRIORITY CLAIM

This application claims priority from Indian patent application No. 1041/Del/2004, filed Jun. 4, 2004, which is incorporated herein by reference.

TECHNICAL FIELD

Embodiments of the present invention generally relate to Voltage Controlled Oscillators (VCO) and in particular relate to a VCO buffer circuit having low supply noise sensitivity for providing a stabilized output.

BACKGROUND

A VCO-buffer circuit is mainly used as interface between a Voltage Controlled Oscillator (VCO) and counters in a PLL (Phase Locked Loop). The purpose of the VCO-buffer circuit is to shift the level of the VCO output voltage to a level suitable for the counters operation so as to adjust the duty cycle of the counters. Here the VCO-buffer circuit for Ring VCO (hereinafter referred to as RING/VCO) is used as an interface.

One conventional VCO provides a VCO buffer cell that comprises a differential pair of transistors and a current mirror circuit. The differential pair of transistors receives input terminals and generates a differential voltage swing in response to the input signals. The current mirror circuit is operably coupled to the pair of transistors and is configured to receive a first external reference current and provide a mirrored current to an active one of the transistors. The VCO circuit provides high-speed consistent output but uses additive circuitry for the purpose and therefore causes an increase in the overall device area, which is undesirable in area specific Voltage Controlled Oscillators.

Figure 1:
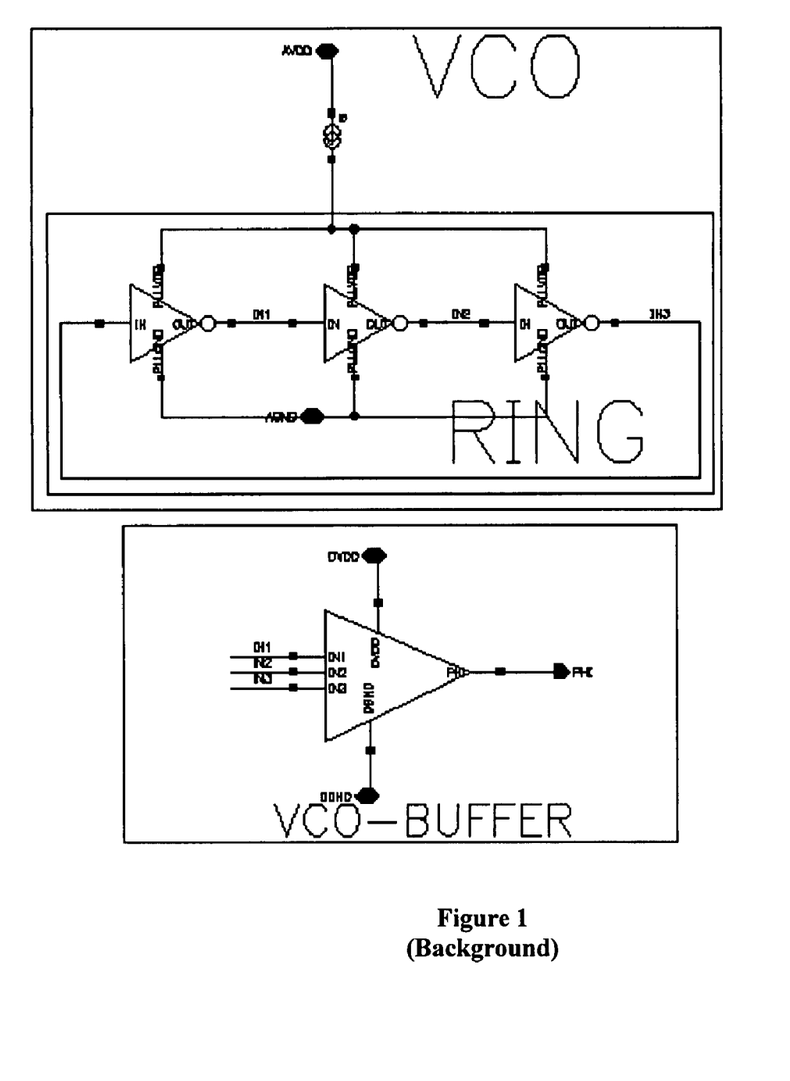
FIG. 1 illustrates a conventional circuit diagram of a Ring Voltage Controlled Oscillator (RING/VCO) and VCO buffer.

Schematics of conventional VCO and VCO buffer circuits are shown in FIG. 1. The Ring Oscillator shown is a three-stage oscillator circuit. The three stages of the oscillator are the inverter stages. The oscillation frequency of the Ring is determined by the delay in the inverting stages. The VCO buffer shown is coupled between the VCO and the counters in the Phase Locked Loop. As shown in the figure it is a three input (IN1, IN2, IN3) device powered by a higher voltage supply DVDD and connected to ground at DGND. It generates an output PHI that serves to shift the level of the VCO output voltage to a level suitable for the counters operation so as to adjust the duty cycle of the counters.

The following symbols are used hereafter for the analysis of the VCO buffer circuit:
Vthn=Threshold Voltage of NMOS transistors
Vthp=Threshold Voltage of PMOS transistors
Kn=Transconductance Parameter of NMOS transistors
Kp=Transconductance Parameter of NMOS transistors
VIN=Input voltage to the stages for loading the RING.
DVDD=Digital Supply Voltage input to the VCO and VCO-buffer circuit.
Vo1h=Minimum High output voltage.
Vo1l=Maximum Low output voltage.
Vm=Peak value of the input voltage.

Figure 2:
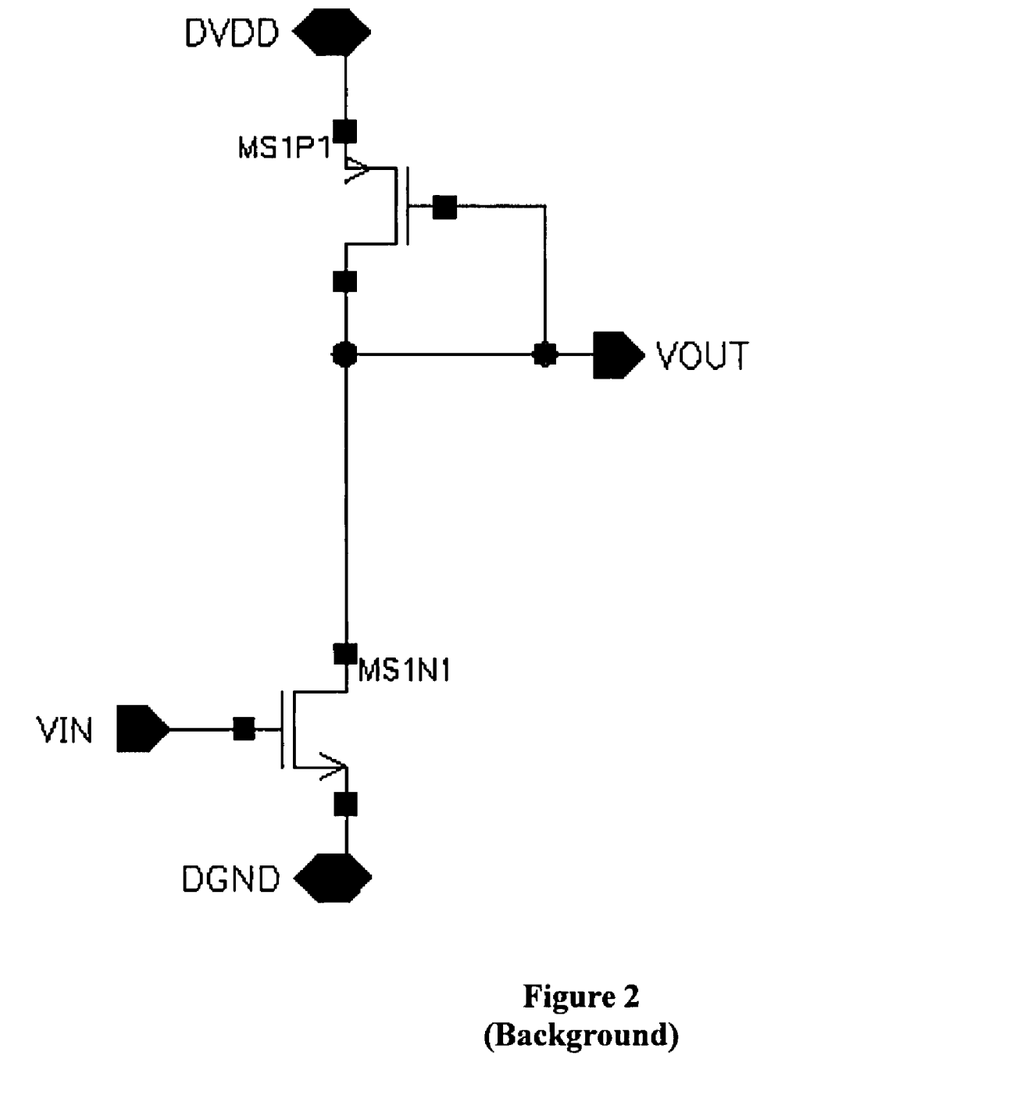
FIG. 2 illustrates a conventional circuit for loading the nodes of the RING.
Figure 3:
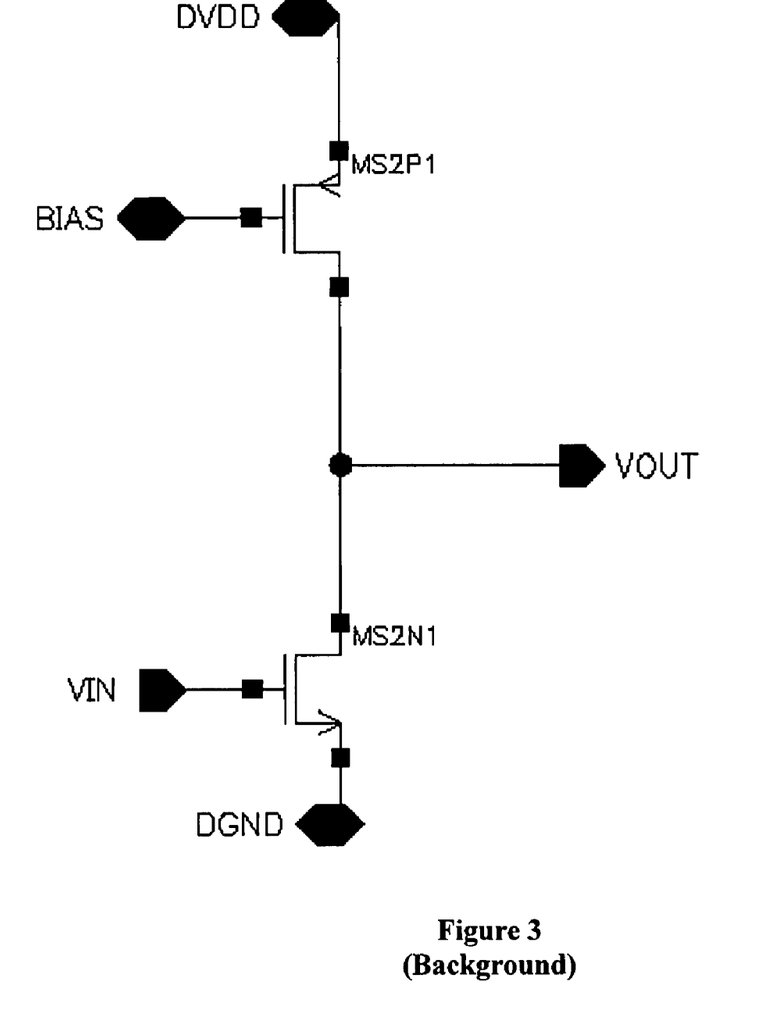
FIG. 3 illustrates another conventional circuit for loading the nodes of the RING.

The nodes of the RING are loaded by a stage as shown in FIG. 2, which is a transistorized circuit formed by PMOS MS1P1 and NMOS MS1N1 or by a stage as shown in FIG. 3, which is formed by PMOS MS2P1 and NMOS MS2N1, wherein the input to NMOS is VIN and a bias signal BIAS is applied to the PMOS transistor. The following cases are considered for loading the VCO circuit (FIG. 1) by the stages shown in FIGS. 2 & 3.

Case (1) when $VIN=0$; $Vo1h=DVDD-Vthp$     1.1

Case (2) when VIN=Vm;

$Vo1l=(DVDD-Vthp)+((2*\beta s1n1)/\beta s1p1)*(Vm-Vthn)-((2*\beta s1n1)/\beta s1p1)*(Vm-Vthn)*sqrt(1+(\beta s1n1*(Vm-Vthn))/(\beta s1p1*(DVDD-Vthp)))$     1.2 where, $\beta s1n1=Kn*(W/L)s1n1$ and $\beta s1p1=Kp*(W/L)s1p1$.

If the digital supply changes by a small amount ΔDVDD, then the corresponding change in Vo1l is given by:

$\Delta Vo1l=\Delta DVDD(1-1/sqrt((1+(\beta s1p1*(DVDD-Vthp))/(\beta s1n1*(Vm-Vthn))))$     1.3

If the digital supply changes by a small amount ΔDVDD, then the corresponding change in Vo1h is given by:

$\Delta Vo1h=\Delta DVDD$     1.4

For the circuit shown in FIG. 1;

Case (1) when VIN=0; Vo2h=DVDD     1.5

Case (2) when VIN=Vm; Vo2l=0     1.6

If the digital supply changes by a small amount ΔDVDD, then there is no change in Vo2l. The change in Vo2h is given by:

$\Delta Vo2h=\Delta DVDD$     1.7

Figure 4:
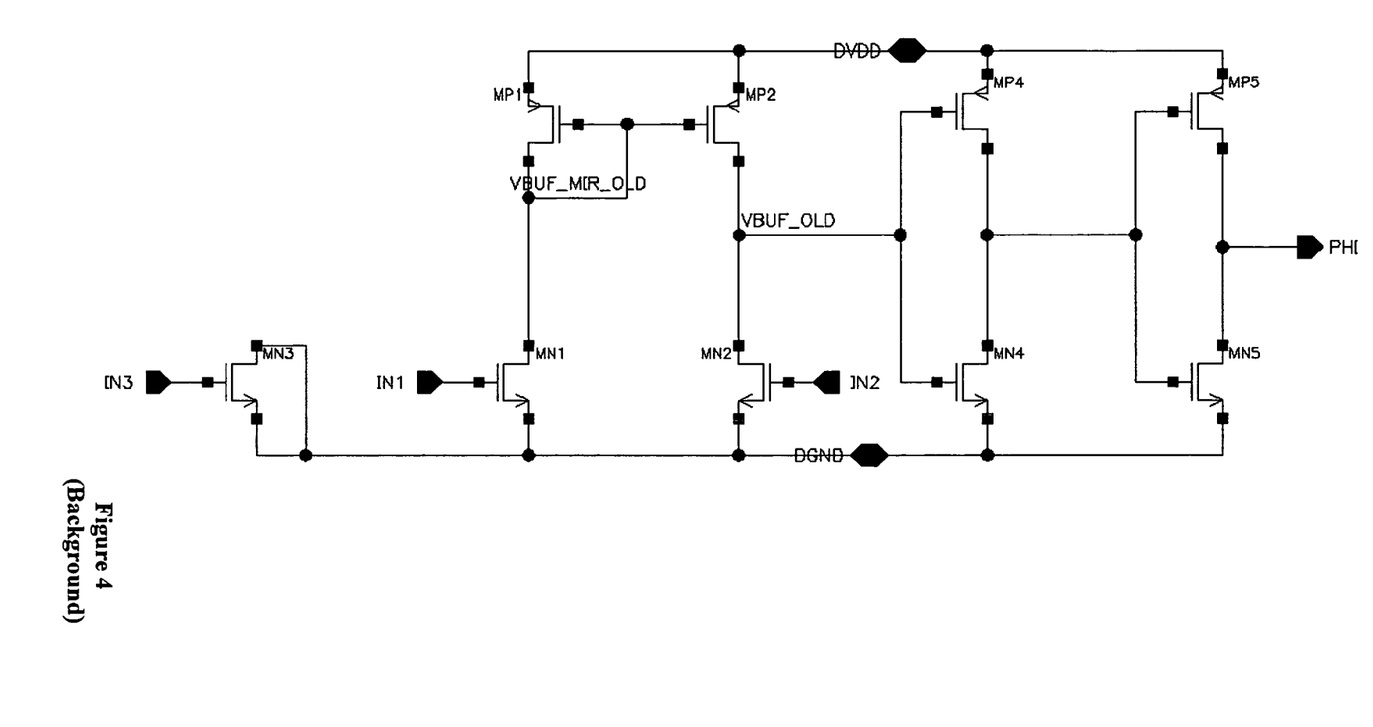
FIG. 4 illustrates another existing circuit of the VCO-buffer.

FIG. 4 shows a conventional VCO-buffer circuit. The operation of the circuit is discussed as follows:

Case 1: When IN1=0, IN2=Vm;

Case 2: When IN1=Vm, IN2=0;

Case 3: When IN1=Vm, IN2=Vm;

Case 4: When IN1=0, IN1=0.

Case (1): In this case the voltage at node VBUF_MIR_OLD is Vo1h (equation 1.1) that causes PMOS MP2 to be switched off. Further, since IN2=Vm, the node VBUF_OLD discharges to zero volt.

Case (2) In this case the voltage at node VBUF_MIR_OLD is Vo1l (equation 1.2) that causes PMOS MP2 to be switched on. Further, since IN2=0 volt, the node VBUF_OLD charges to DVDD.

Case (3) In this case the voltage at VBUF_MIR_OLD node is Vo1l (equation 1.2) that causes both the PMOS MP2 and NMOS MN2 to be switched on and the voltage at VBUF_MIR_OLD is determined by the relative sizes of the transistors MP2 and MN2.

Case (4) In this case both PMOS MP2 and NMOS MN2 are switched off. The voltage at node VBUF_MIR_OLD is determined by the value of VBUF_MIR_OLD, before IN1 and IN2 both become zero volt.

As shown in FIG. 4 transistors MN1 and MN2 of the buffer load the VCO at two inputs (nodes IN1 and IN2). A dummy transistor MN3 is used to load input IN3 for providing balanced load distribution on the three nodes of the VCO. Symmetric loading is necessary so that the oscillation amplitude at each of the three nodes is the same, which in turn improves the phase noise performance of the VCO.

The capacitances by which these nodes are being loaded (by the buffer only) are the gate to source capacitance (Cgs)

and the gate to drain capacitance (Cgd) of the transistors MN1, MN2 and MN3. During each oscillation cycle IN1 or IN2 or IN3 oscillate from zero volt to Vm and then again to zero volt (Loads are being charged and discharged). Here, charging and discharging of the Gate to Drain Capacitances of transistors MN1, MN2 and MN3 are discussed, because the amount of charge on these capacitors depends upon the value of DVDD.

Assuming the digital supply to be at DVDD, the VCO-buffer circuit operates for the following input-output parameters:

When IN1=0, the voltage at node VBUF_MIR_OLD is Vo1h (equation 1.1);

when IN1=Vm, the voltage at node VBUF_MIR_OLD is Vo1l (equation 1.2);

when IN1=0 and node VBUF_MIR_OLD at Vo1h the charge on the drain to gate capacitor of MN1 is given by:

$$Qicgd = Cgd*(Vo1h-0) \qquad 1.8$$

When IN1=Vm and node VBUF_MIR_OLD at Vo1l (equation 1.2) charge on drain to gate capacitor of MN1 is given by:

$$Qfcgd = Cgd*(Vo1l-Vm) \qquad 1.9$$

If the oscillation frequency is fo then the average current per cycle used to charge this capacitor is given by:

$$Iavch1 = (fo/2)*(Qfcgd - Qicgd) \qquad 1.10$$
$$=> Iavch1 = (fo/2)*Cgd(Vo1l - Vm - Vo1h + 0)$$

The direction of this current is through drain to gate capacitor of transistor MN1 into the RING. Further, the current directly adds to the current going into the RING and depending on the amount of current going into the RING the oscillation frequency of the VCO is fixed.

Assuming that the digital supply changes from DVDD to DVDD+ΔDVDD, then it is observed that the average current by which the capacitor is being charged each cycle changes from $(fo/2)*C_{gd}(V_{o1l}-Vm-Vo1h+0)$ to $(fo/2)*Cgd(Vo1l+\Delta Vo1l-Vm-Vo1h-\Delta Vo1h+0)$. The change in average charging current Iavch1 is given by:

$$\Delta Iavch1 = (fo/2)*C_{gd}(\Delta Vo1l - \Delta Vo1h) \qquad 1.11$$

Applying similar analysis to charging of drain to gate capacitor of transistor MN2, which is driven by node IN2 we can say that average current by which this capacitor is being charged each cycle changes from $(fo/2)*Cgd(Vo2l-Vm-Vo2h+0)$ to $(fo/2)*Cgd(Vo2l-Vm-Vo2h-\Delta Vo2h+0)$. The change in average charging current Iavch2 is given by:

$$\Delta Iavch2 = (fo/2)*Cgd(-\Delta Vo1h) \qquad 1.12$$

From equations 1.11 and 1.12 we note that |ΔIavch2|>>ΔIavch1.

This implies that the current that is going into the RING for a particular control voltage increases by ΔIavch1+ΔIavch2. Since both the quantities ΔIavch1 and ΔIavch2 are negative we can also say that the current that is going into the RING for a particular control voltage reduces by |ΔIavch1|+|ΔIavch2|. As a result the oscillation frequency reduces and when there is negative jump on the digital supply it can be proved by a similar argument that the oscillation frequency increases. A similar analysis can be done for the discharging current of the gate to drain capacitances of the transistors loading the RING.

The noise on the digital supply causes the oscillation frequency of the RING to vary which is mainly due to the changes in the charging and discharging currents of the gate to drain capacitances of the transistors loading the RING, which is undesirable for the operation of the VCO and VCO-buffer interface.

Thus, a need is felt for VCO buffer circuit that reduces the variation in oscillation frequency of the ring oscillator.

SUMMARY

According to one embodiment of the present invention, an improved VCO buffer reduces supply noise sensitivity of frequency of oscillations of the VCO.

Other embodiments of the present invention are directed to improving the phase noise performance of the VCO.

According to one embodiment of the instant invention, a VCO buffer circuit comprises:

a first loading means receiving a first signal for loading the VCO at a first input node;

a second loading means receiving a second signal for loading the VCO at a second input node;

a third loading means coupled to said first loading means for loading the VCO at a third input node to thereby provide balanced load distribution on three nodes of VCO;

at least three current controlling means coupled to each other to form a symmetrical configuration and receiving input signals from said first and second loading means for minimizing the variations in the oscillation frequency of the VCO; and a means for buffering the output of said current controlling means.

Further, according to another embodiment of the present invention a method providing a VCO buffer circuit comprises steps of:

loading the VCO at the first input node by a first loading means;

loading the VCO at second input node by a second loading means;

balancing load distribution on three nodes of the VCO by loading the VCO at the third input node by a third loading means;

minimizing variations in the oscillation frequency of the VCO by symmetrically connecting at least three current controlling means to said first and second loading means; and buffering the output of said current controlling means.

Thus, embodiments of the instant invention provide an improved VCO buffer with low supply noise sensitivity to thereby provide improved phase noise performance of the VCO.

BRIEF DESCRIPTION OF THE DRAWINGS

Embodiments of the invention will now be described with reference to the accompanying drawings.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

FIGS. 1, 2, 3 & 4 have been described under the heading titled, "Background".

The VCO buffer of the instant invention comprises of a symmetrical current mirror structure that is formed by connecting two current mirror circuits to the first current mirror circuit, as shown in FIG. 4. Thus the resultant structure of the VCO buffer comprises a symmetrical current mirror circuit configuration between the transistor MN11 and MN22, wherein these transistors receive inputs at the nodes IN1 and IN2 respectively. Another input signal is provided to the VCO at the third input node IN3 for providing balanced load distribution on the three nodes of the VCO.

Figure 5:
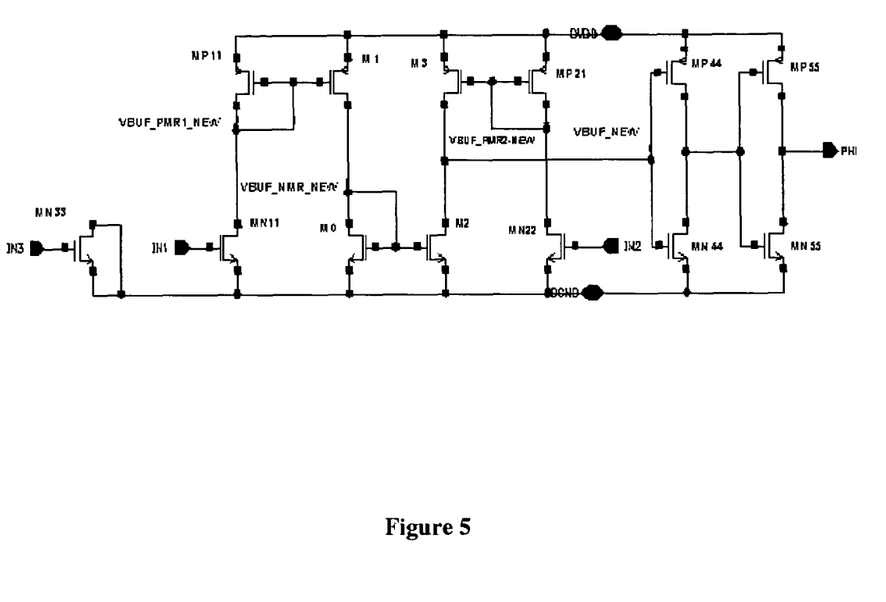
FIG. 5 illustrates the circuit diagram of the VCO-buffer in accordance with the instant invention.

The first current mirror circuit is formed by MP11 and M1 transistors, that generate a first voltage at the node VBUF_PMIR1_NEW. The first current mirror configuration is coupled to the first input node IN1 through NMOS MN11. A second current mirror circuit is formed by NMOS transistors M0 and M2 and is coupled to the output of the first current mirror circuit for generating a second voltage at node VBUF_NMIR_NEW, which is further connected to a third current mirror circuit formed by the PMOS transistors M3 and MP21 to thus form a symmetrical current mirror circuit configuration. This configuration of current mirrors generates a third voltage at the node VBUF_PMIR2_NEW. It can be clearly observed therefore that the supply sensitivity is minimized because the nodes IN1 and IN2 of the ring are now loaded by two identical current mirror stages. Finally, the cumulative output of the three current mirror stages is produced at the node VBUF_NEW.

A transistorized inverter circuit (MP44 & MN44) receives the common output of the three current mirror stages. Another inverter circuit (MP55 & MN55) is connected to the output of the inverter circuit formed by (MP44 & MN44) for buffering the output of the current mirror stages to thereby adjust the duty cycle of the Voltage Controlled Oscillator. The VCO buffer circuit is powered by DVDD and is connected to the ground at DGND.

If the oscillation frequency of the VCO is fo then the average current per cycle used to charge the drain to gate capacitors of transistors MN11 and MN22 which are driven by nodes IN1 and IN2 of the RING respectively is given by:

$$Iavch11 = Iavch22 = (fo/2) * (Qfcgd - Qicgd); \quad\quad 1.13$$

$$=> Iavch11 = Iavch22 = (fo/2) * Cgd(Vol - Vm - Vo1h + 0)$$

Assuming that the digital supply changes from DVDD to DVDD+ΔDVDD, then the change in average charging current Iavch11 and Iavch22 is given by:

$$\Delta Iavch11 = \Delta Iavch11 = (fo/2) * Cgd(\Delta Vo1l - \Delta Vo1h) \quad\quad 1.14$$

This implies that the current that is going into the RING for a particular control voltage increases by 2*ΔIavch11. The value of ΔIavch11 is negative, thus it can be concluded that the current that is going into the RING for a particular control voltage reduces by 2*|ΔIavch11|.

Further, since |ΔIavch2|>>ΔIavch1, 2*|ΔIavch11|<<|ΔIavch1|+|ΔIavch2|, the change in the current going into the RING (due to change in digital supply) for the VCO-buffer of the instant invention is much less than that for the VCO-buffer shown in FIG. 4.

The conventional VCO buffer circuit of FIG. 4 and the VCO buffer according to the instant invention were both simulated with 100 mv jump on the digital supply voltage. The resulting change in frequency of the VCO across all possible corners is tabulated below.

TABLE 1

| Corner | Temperature (Degrees) | Change in frequency (FIG. 5) (Hz) | Change in frequency (FIG. 4) (Hz) |
| --- | --- | --- | --- |
| TYPICAL | 40 | $1.85 * 10^5$ | $2.13 * 10^6$ |
| SLOW | −40 | $3.17 * 10^5$ | $2.92 * 10^6$ |
| SLOW | 125 | $6.50 * 10^5$ | $1.31 * 10^6$ |
| FAST | −40 | $4.59 * 10^4$ | $1.92 * 10^6$ |
| FAST | 125 | $5.00 * 10^5$ | $2.76 * 10^6$ |

It can be clearly seen from the Table 1 that the VCO buffer circuit of the instant invention reduces the supply noise sensitivity by reducing the amount of change in the charging and discharging currents of the gate to drain capacitances of the transistors loading the VCO. Thus, the VCO buffer circuit of the instant invention leads to less supply sensitivity by loading the nodes IN1 and IN2 by two identical stages to form a symmetrical current mirror configuration.

A VCO buffer as described with reference to the embodiment of FIG. 5 may be utilized in a variety of different types of electronic circuits, such as a phase-locked loop as previously mentioned. Such circuits may, in turn, be utilized in a variety of different types of integrated circuits, such as in microprocessors and communications-related integrated circuits.

From the foregoing it will be appreciated that, although specific embodiments of the invention have been described herein for purposes of illustration, various modifications may be made without deviating from the spirit and scope of the invention.

We claim:

1. A VCO buffer circuit comprising:
    a first loading means receiving a first signal for loading a VCO at a first input node;
    a second loading means receiving a second signal for loading the VCO at a second input node;
    a third loading means coupled to said first loading means for loading the VCO at third input node to thereby provide balanced load distribution on three nodes of VCO;
    at least three current controlling means coupled to each other to form a symmetrical configuration and receiving input signals from said first and second loading means for minimizing the variations in the oscillation frequency of the VCO; and a means for buffering the output of said current controlling means.

2. A VCO buffer circuit as claimed in claim 1, wherein said first, second and third loading means comprising MOS transistors.

3. A VCO buffer circuit as claimed in claim 1, wherein said current controlling means are current mirror circuits.

4. A VCO buffer as claimed in claim 3, wherein said current mirror circuits comprise MOS transistors.

5. A VCO buffer as claimed in claim 1, wherein said means for buffering comprise at least two inverter circuits.

6. A method for providing a VCO buffer circuit, comprising steps of:

loading a VCO at a first input node by a first loading means;

loading the VCO at a second input node by a second loading means;

balancing a load distribution on three nodes of the VCO by loading the VCO at a third input node by a third loading means;

minimizing variations in the oscillation frequency of the VCO by symmetrically connecting at least three current controlling means to said first and second loading means; and buffering the output of said current controlling means.

7. A buffer circuit, comprising:

a first loading circuit including a first node adapted to receive a first input signal and having a first output node, the first loading circuit presenting a first load to the first input signal and being operable to develop a first output signal on the first output node responsive to the first input signal;

a second loading circuit including a second node adapted to receive a second input signal and having a second output node, the second loading circuit presenting a second load to the second input signal and being operable to develop a second output signal on the second output node responsive to the second input signal;

a symmetrical current controlling circuit coupled between the first and second output nodes of the first and second loading circuits, the symmetrical current controlling circuit including at least three interconnected current controlling circuits operable to develop an unbuffered output signal on an unbuffered output node responsive to the first and second output signals and operable to cause the first and second loads presented on the first and second input nodes to be substantially equal; and a third loading circuit including a third input node and adapted to receive a third input signal, the third loading circuit presenting a third load to the third input signal to thereby provide a balanced load distribution on the three input nodes.

8. The buffer circuit of claim 7 further comprising a buffer having a buffered input node coupled to the unbuffered output node and operable to develop a buffered output signal on a buffered output node responsive to the unbuffered input signal.

9. The buffer circuit of claim 8 wherein the buffer comprises at least two invertors connected in series between the unbuffered output node and the buffered output node.

10. A buffer circuit, comprising:

a first loading circuit including a first node adapted to receive a first input signal and having a first output node, the first loading circuit presenting a first load to the first input signal and being operable to develop a first output signal on the first output node responsive to the first input signal;

a second loading circuit including a second node adapted to receive a second input signal and having a second output node, the second loading circuit presenting a second load to the second input signal and being operable to develop a second output signal on the second output node responsive to the second input signal;

a symmetrical current controlling circuit coupled between the first and second output nodes of the first and second loading circuits, the symmetrical current controlling circuit operable to develop an unbuffered output signal on an unbuffered output node responsive to the first and second output signals and operable to cause the first and second loads presented on the first and second input nodes to be substantially equal, wherein the symmetrical current controlling circuit comprises at least three current mirrors;and a third loading circuit including a third input node and adapted to receive a third input signal, the third loading circuit presenting a third load to the third input signal to thereby provide a balanced load distribution on the three input nodes.

11. The buffer circuit of claim 10 wherein the symmetrical current controlling circuit further comprises:

a first current mirror formed by a first diode-coupled MOS transistor coupled between a supply voltage node and the first output node of the first loading circuit, and including a second MOS transistor coupled between the supply voltage node and a first current output node, with a gate of the second MOS transistor being coupled to a gate of the first diode-coupled MOS transistor;

a second current mirror formed by a second diode-coupled MOS transistor coupled between the supply voltage node and the second output node of the second loading circuit, and including a third MOS transistor coupled between the supply voltage node and a second current output node, with a gate of the third MOS transistor being coupled to a gate of the second diode-coupled MOS transistor; and a third current mirror formed by a third diode-coupled MOS transistor coupled between a reference voltage node and the first current output node of the first current mirror, and including a fourth MOS transistor coupled between the reference voltage node and the second current output node, with a gate of the fourth MOS transistor being coupled to a gate of the third diode-coupled MOS transistor.

12. The buffer circuit of claim 11 wherein the first and second diode-coupled MOS transistors and the second and third MOS transistors each comprise a PMOS transistor and wherein the third diode-coupled MOS transistor and the fourth MOS transistor each comprise an NMOS transistor.

13. An integrated circuit, comprising:

an electronic circuit including a buffer circuit including, a first loading circuit including a first node adapted to receive a first input signal and having a first output node, the first loading circuit presenting a first load to the first input signal and being operable to develop a first output signal on the first output node responsive to the first input signal;

a second loading circuit including a second node adapted to receive a second input signal and having a second output node, the second loading circuit presenting a second load to the second input signal and being operable to develop a second output signal on the second output node responsive to the second input signal; and a symmetrical current controlling circuit coupled between the first and second output nodes of the first and second loading circuits, the symmetrical current controlling circuit including at east three interconnected current controlling circuits operable to develop an unbuffered output signal on an unbuffered output node responsive to the first and second output signals and operable to cause the first and second loads presented on the first and second input nodes to be substantially equal; and a third loading circuit including a third input node and adapted to receive a third input signal, the third loading circuit presenting a third load to the third input signal to thereby provide a balanced load distribution on the three input nodes.

14. The integrated circuit of claim 13 wherein the electronic circuit comprises a phase-locked loop.

15. An integrated circuit, comprising:

an electronic circuit including a buffer circuit including, a first loading circuit including a first node adapted to receive a first input signal and having a first output node, the first loading circuit presenting a first load to the first input signal and being operable to develop a first output signal on the first output node responsive to the first input signal;

a second loading circuit including a second node adapted to receive a second input signal and having a second output node, the second loading circuit presenting a second load to the second input signal and being operable to develop a second output signal on the second output node responsive to the second input signal;

a third loading circuit including a third input node and adapted to receive a third input signal, the third loading circuit presenting a third load to the third input signal to thereby provide a balanced load distribution on the three input nodes; and a symmetrical current controlling circuit coupled between the first and second output nodes of the first and second loading circuits, the symmetrical current controlling circuit including at least three interconnected current controlling circuits operable to develop an unbuffered output signal on an unbuffered output node responsive to the first and second output signals and operable to cause the first and second loads presented on the first and second input nodes to be substantially equal, and wherein the integrated circuit comprises a microprocessor.

* * * * *